United States Patent
Reinprecht et al.

(10) Patent No.: US 8,525,266 B2
(45) Date of Patent: Sep. 3, 2013

(54) SEMICONDUCTOR BODY HAVING A TERMINAL CELL

(75) Inventors: Wolfgang Reinprecht, Tobelbad (AT); Frederic Roger, Graz (AT)

(73) Assignee: AMS AG, Unterpremstaetten (AT)

(*) Notice: Subject to any disclaimer, the term of this patent is extended or adjusted under 35 U.S.C. 154(b) by 24 days.

(21) Appl. No.: 13/407,575

(22) Filed: Feb. 28, 2012

(65) Prior Publication Data
US 2012/0211842 A1 Aug. 23, 2012

Related U.S. Application Data

(63) Continuation of application No. PCT/EP2010/062586, filed on Aug. 27, 2010.

(30) Foreign Application Priority Data

Aug. 28, 2009 (DE) .......... 10 2009 039 247

(51) Int. Cl.
H01L 23/62 (2006.01)
(52) U.S. Cl.
USPC .......................................... 257/355; 257/351
(58) Field of Classification Search
USPC ............... 257/341–363, E29.008, E29.015
See application file for complete search history.

(56) References Cited

U.S. PATENT DOCUMENTS

| | | | |
|---|---|---|---|
| 6,060,752 A * | 5/2000 | Williams | 257/355 |
| 6,661,631 B1 | 12/2003 | Meador et al. | |
| 7,253,999 B2 | 8/2007 | Ker et al. | |
| 7,348,793 B2 | 3/2008 | Cecchi | |
| 7,605,428 B2 * | 10/2009 | Williams et al. | 257/335 |
| 8,258,575 B2 * | 9/2012 | Williams et al. | 257/349 |
| 2002/0149059 A1 | 10/2002 | Ker et al. | |
| 2003/0137861 A1 | 7/2003 | Thies et al. | |
| 2005/0045952 A1 | 3/2005 | Chatty et al. | |
| 2006/0028776 A1 | 2/2006 | Stockinger et al. | |
| 2006/0223258 A1 | 10/2006 | Okushima | |
| 2006/0231895 A1 | 10/2006 | Duvvury et al. | |
| 2007/0002508 A1 | 1/2007 | Vanysacker et al. | |
| 2013/0020646 A1 * | 1/2013 | Deval et al. | 257/355 |

FOREIGN PATENT DOCUMENTS

EP 0 660 410 11/1994

* cited by examiner

Primary Examiner — Cuong Q Nguyen
(74) Attorney, Agent, or Firm — McDermott Will & Emery LLP

(57) ABSTRACT

A semiconductor body comprising a first connection for feeding an upper supply potential and a first and a second terminal cell, which are situated at a distance from each other. The semiconductor body further comprises an arrester structure, which is arranged between the first and second terminal cells in a p-doped substrate. The arrester structure comprises a first and a second p-channel field-effect transistor structure, each of which is set in a respective n-doped well substantially parallel to the first and second terminal cells, and a diode structure with a p-doped region set in a further n-doped well between the n-doped wells of the first and second p-channel field-effect transistor structures. The diode structure is designed to activate the first and second p-channel field-effect transistor structure as arrester elements during an electrostatic discharge in the semiconductor body.

15 Claims, 7 Drawing Sheets

SEMICONDUCTOR BODY HAVING A TERMINAL CELL

RELATED APPLICATION

This is a continuation of International Application No. PCT/EP2010/062586, filed on Aug. 27, 2010, which claims priority from German Patent Application No. 10 2009 039 247.5 filed Aug. 28, 2009, the contents of both of which are hereby incorporated by reference.

FIELD OF THE INVENTION

The invention concerns a semiconductor body having at least one terminal cell and having an arrester structure.

The terminal cell can in particular have a terminal surface as an input contact and/or output contact.

BACKGROUND OF THE INVENTION

Terminal cells are employed in integrated semiconductor circuits to make a contact from the integrated circuit to external circuits. In particular, such contacts serve to feed supply voltages or reference voltages. In addition, control signals, data signals or any other signals can be sent to or taken from the integrated circuit via the contacts.

Fault situations can arise in the operation of the integrated circuit, for example, if overvoltages are applied to the contacts or because of electrostatic discharges. So that such overvoltages do not cause damage or destruction of the integrated circuit, protective elements through which the resulting currents can be drained are used in many cases. However, due to the design of the field-effect transistor structures in combination with the substrate of the semiconductor body of the integrated circuit parasitic bipolar structures form, through which significant currents arise in the event of a fault. In particular, currents are produced in the substrate that, under certain voltage conditions, lead to a permanent low-resistance condition in the parasitic bipolar structures. In many cases this can lead to destruction of the semiconductor body having the integrated circuit. Such a condition is also known as a latch-up effect.

To limit the consequences of a latch-up effect, it is proposed in traditional circuits to detect a current in the substrate and, if a current is detected, to disconnect the circuit from the corresponding terminals or contacts via a built-in switch. However, since in this case a fault current has already developed in the substrate, destruction of the semiconductor circuit cannot be prevented under certain circumstances, especially since a significant number of charge carriers are already moving in the substrate. Furthermore, a function of the circuit becomes limited or completely interrupted by the disconnection of the contact from the circuit.

US 2006/0223258 A1 concerns a manufacturing process for a semiconductor body having complementary metal-oxide semiconductor transistors and a bipolar transistor. A protective arrangement comprises a trigger element and a protective element having two bipolar transistors.

SUMMARY OF THE INVENTION

One object of the invention is to provide a semiconductor body having a terminal cell that is better protected against damage due to overvoltages.

In an embodiment example of a semiconductor body having a terminal cell, the terminal cell has a terminal surface, a first terminal for feeding an upper supply potential and a second terminal for feeding a lower supply potential. The upper supply potential is higher than the lower supply potential. The terminal cell additionally has a p-channel field-effect transistor structure formed in the semiconductor body and having a p-doped first sensor region at a distance from its drain region. In addition, an n-channel field-effect transistor structure of the terminal cell is formed in the semiconductor body and has an n-doped second sensor region at a distance from its drain region.

In the p-channel field-effect transistor structure the drain region is electrically connected to the terminal surface, a source region is electrically connected to the first connection, and the first sensor region is electrically connected via a first resistance element to the second connection and directly to a gate connection of the n-channel field-effect transistor structure. Furthermore, in the re-channel field-effect transistor structure, the drain region is electrically connected to the terminal surface, a source region is electrically connected to the second terminal, and the second sensor region is electrically connected to the first terminal through a second resistance element and to a gate terminal of the p-channel field-effect transistor structure directly.

If there is a positive overvoltage at the terminal surface, current does not flow from the drain region of the p-channel field-effect transistor structure into the substrate of the semiconductor body, but rather drains through the first sensor region and the first resistance element to the second terminal. Because of this, a voltage drop arises across the first resistance element that controls the gate of the re-channel field-effect transistor structure. Through this the overvoltage can drain from the terminal surface via the drain and source of the n-channel field-effect transistor structure to the second terminal. Flow of current into the substrate of the semiconductor body is thus effectively prevented.

The terminal cell reacts similarly if a negative overvoltage, or a voltage that is considerably lower than the lower supply voltage at the second terminal, is applied to the terminal surface. In this case a flow of current is produced from the drain region of the n-channel field-effect transistor structure to the second sensor region and in this way draining of charge carriers into the substrate is prevented. Current flows from the second sensor region through the second resistance element to the first terminal, where the current value is negative with said assumed direction of current flow. The voltage drop across the second resistance element controls the gate of the p-channel field-effect transistor structure, so that a fault current can drain through the drain region and the source region of the p-channel field-effect transistor structure to the first terminal, again with negative current value. In this case as well, draining of charge carriers into the substrate, which could destroy the semiconductor body, is prevented.

Preferably, the first sensor region and the drain region of the p-channel field-effect transistor structure together with a region lying between them form a PNP bipolar structure, for example in the form of a lateral bipolar transistor. For example, the region lying in between is an n-doped well, in which the drain region and the first sensor region are made. Furthermore, the second sensor region and the drain region of the n-channel field-effect transistor structure together with a region lying between them preferably form an NPN bipolar structure, for example again in the form of a lateral bipolar transistor.

The effect or the importance of otherwise occurring parasitic bipolar structures is reduced with the bipolar structures intentionally formed by the sensor regions. In particular, the sensor regions are arranged in the semiconductor body so that charge carriers that are put into motion by overvoltages are preferably drawn to the sensor regions and not into the substrate.

In an embodiment the semiconductor body comprises a p-doped substrate, in which the p-channel field-effect transistor structure and the n-channel field-effect transistor structure are made. For example, the p-channel field-effect transistor structure is made in a first n-doped well within the substrate, where the associated drain region and the associated source region are each made as p-doped regions within the first n-doped well and the first n-doped well is electrically connected to the first terminal.

In an embodiment based thereon the first sensor region is made within the substrate, and the first sensor region is more heavily p-doped than the substrate is.

However, in an alternative and preferred embodiment the first sensor region is made within the first n-doped well. For example, the drain region, the n-doped well and the p-doped sensor region form a lateral PNP bipolar transistor.

In another embodiment the first sensor region is arranged to be parallel to and at a distance from the drain region of the p-channel field-effect transistor structure. Alternatively, the first sensor region is arranged at least partly in an arch shape running around the drain region and the source region of the p-channel field-effect transistor structure. In both cases the first sensor region serves as a collecting region for charge carriers leaving the drain region of the p-channel field-effect transistor structure or, in another interpretation of the direction of current flow, as the primary charge carrier supplier.

In one embodiment the n-channel field-effect transistor structure is made in a second n-doped well within the substrate. The drain region of the n-channel field-effect transistor structure is made as an n-doped region within the second n-doped well and is more highly doped than the second n-doped well. The source region of the n-channel field-effect transistor structure is made in a p-doped well within the second n-doped well. The p-doped well is electrically connected to the second terminal. In this embodiment the second sensor region is arranged at a distance from the second n-doped well. Correspondingly, for example, the second sensor region, the substrate region lying between the second sensor region and the second n-doped well together with the second n-doped well form a lateral NPN transistor, through which a current that leads to triggering of the p-channel field-effect transistor flows if there is a fault. A flow of charge carriers in the substrate to the in-between substrate region is limited by the lateral arrangement of second sensor and second n-doped well, so that here, too, a significant flow of current into the p-doped substrate is prevented.

For example, the second sensor region is arranged parallel to and at a distance from the second n-doped well. Alternatively, the second sensor region is arranged at least partly in an arch shape running around the second n-doped well. As noted above for the first sensor region, the second sensor region in the described embodiments also serves as charge carrier supplier if current flow is through the lateral NPN bipolar transistor.

In case of a fault, thus in case of a positive or negative overvoltage, the relevant current that flows through the sensor regions or the lateral bipolar transistors is low. Most of the fault current that arises in each case is drained, specifically through the activated field-effect transistor structure, which is preferably designed to carry large currents. Thus, a latch-up effect is prevented or eliminated by the draining of the relevant latch-up current through the field-effect transistor structures.

If a plurality of terminal cells of the described kind is provided in a semiconductor body, they can easily be positioned close to each other without necessarily providing non-conducting protective regions between the terminal cells. This is possible because significant current flow that could adversely affect adjacent terminal cells does not arise in the substrate with the described terminal cell structures.

Functioning of the terminal cell is also guaranteed in an overload condition, thus if the overvoltage is positive or negative, because a connection to the first and second terminal for feeding the supply potentials is not interrupted. A signal condition at the terminal surface is thus not changed by the protective arrangement having the sensor regions.

In an embodiment the semiconductor body also comprises one or more arrester elements for electrostatic discharges, abbreviated ESD, in addition to terminal cells. Such an arrester element usually has a trigger element like a diode, which in the case of an ESD triggers a built-in arrester element in order to drain the overvoltage as a consequence of the ESD event reliably. If such a diode reacts to current flows particularly sensitively, the danger basically exists that undesirable triggerings of the ESD drain element will occur.

Especially if such an arrester element is arranged with a diode in addition to a terminal cell, charge carriers that pass from the terminal cell into the substrate can generate a current flow in the diode that leads to undesirable triggering. This can be particularly critical if the diode is arranged directly next to the terminal cell in the semiconductor body.

Accordingly, the arrangement described above for preventing undesired charge carriers in the substrate or collecting them in a timely way can be employed to prevent an undesired current in a trigger diode of an arrester element.

For example, a semiconductor body has the first terminal, a first terminal cell and a second terminal cell, which is at a distance from the first terminal cell. The semiconductor body further comprises an arrester structure, which is formed between the first and the second terminal cell in the substrate. The arrester structure in this case has a first and a second p-channel field-effect transistor structure, which are made in the relevant p-doped wells, and a diode structure which is formed with a p-doped region in an additional n-doped well between the n-doped wells of the first and second p-channel field-effect transistor structures. The diode structure in this case is designed to activate the first and second p-channel field-effect transistor structures as arrester elements if there is an electrostatic discharge in the semiconductor body.

The substrate can be a p-doped substrate.

In an embodiment the first and the second p-channel field-effect transistor structures are formed essentially parallel to the first and second terminal cell. "Essentially parallel" here means that the first and the second p-channel field-effect transistor structures are arranged between the first and the second terminal cell. Further, "essentially parallel" can mean that a theoretical connection between the first and the second terminal cell intersects both the n-doped well of the first p-channel field-effect transistor structure and also the n-doped well of the second p-channel field-effect transistor structure. The theoretical connecting line can also intersect the diode structure. The theoretical connecting line can extend from the first terminal cell through the first p-channel effect transistor structure to the diode structure and further from the diode structure across the second p-channel field-effect transistor structure to the second terminal cell.

In an embodiment the diode structure is designed so that for control of the first and second p-channel field-effect transistor structures as arrester elements it generates a control signal that switches the first and the second p-channel field-effect transistor structure to a conducting state.

For one thing, with the proposed structure, the path for charge carriers, which can possibly pass from the terminal cell into the substrate to the diode structure, is enlarged by comparison with traditional arrangements. Thus, small charge carrier concentrations simply do not reach the diode structure as a carrier element, so that a first protection is ensured.

Moreover, the relevant p-doped wells of the first and second p-channel field-effect transistor structure are preferably connected to the first terminal for feeding the upper supply potential or alternatively are connected to a terminal for another higher potential. Thus, charge carriers that pass from the adjacent terminal cells into the substrate are preferably taken into the relevant p-doped wells, so that they cannot reach the diode structure situated between the p-channel field-effect transistor structures. Consequently, a sensitive trigger structure having a diode is also protected against undesirable triggering by charge carriers in the substrate.

In an embodiment the additional n-doped well of the diode structure is electrically connected to the first terminal via a third resistance element and directly to the gate terminals of the first and second p-channel field-effect transistor structure. Thus, a triggering by the diode structure in the case of an ESD is guaranteed.

The described arrangement of terminal cells and arrester structure between them can be made with traditional terminal cells. However, in an advantageous embodiment one or both adjacent terminal cells per the terminal cell described at the start is designed with a first and second sensor region. In this way sufficient protection against unintended triggering of the arrester structure because of charge carriers in the substrate can be prevented even for particularly sensitive cases.

BRIEF DESCRIPTION OF THE DRAWINGS

In the figures, like reference numbers refer to like elements or structures. Insofar as elements or structures correspond in function, their description will not be repeated in any of the following figures.

DETAILED DESCRIPTION OF THE DRAWINGS

Figure 1:
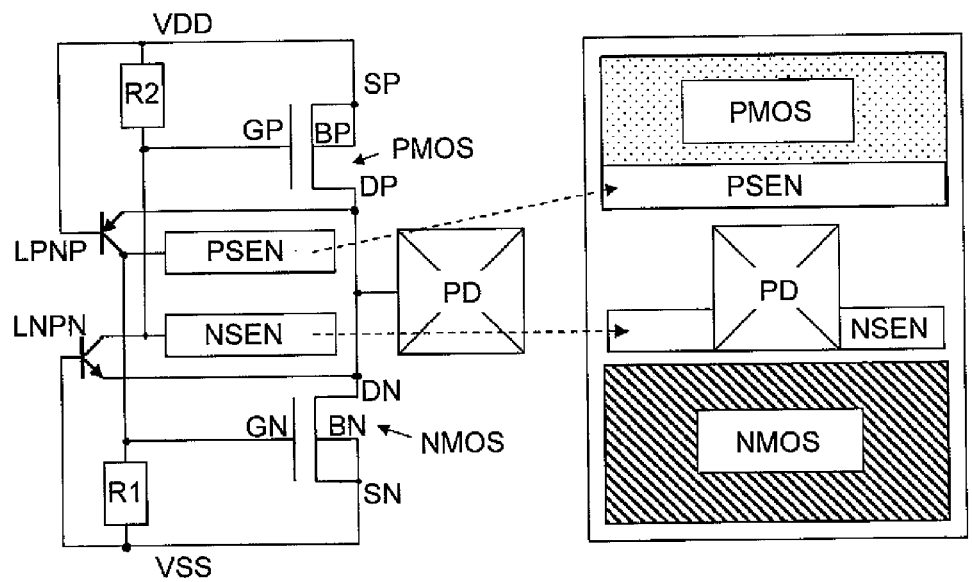
FIG. 1 illustrates a first embodiment example of a semiconductor body with a terminal cell as a block circuit and as the overall layout in the semiconductor body.

FIG. 1 illustrates an embodiment example of a semiconductor body with a terminal cell, where the right-hand side of the drawing illustrates a top view of the semiconductor body and the left-hand side of the drawing illustrates a block circuit diagram of the terminal cell. The semiconductor body comprises a p-channel field-effect transistor structure PMOS, abbreviated p-channel structure, in which a p-doped first sensor region PSEN is embedded. The semiconductor body additionally comprises an n-channel field-effect transistor structure NMOS, abbreviated n-channel structure, spaced apart from which is an n-doped second sensor region NSEN. Furthermore, a terminal surface PD is provided in the semiconductor body or on the semiconductor body.

It is evident from the block diagram on the left hand side that the terminal surface PD is directly electrically connected to the relevant drain terminals DP and DN of the p-channel structure PMOS and the n-channel structure NMOS. A source terminal SP of the p-channel structure PMOS is connected directly to a first terminal VDD, through which an upper supply potential can be supplied. The bulk terminal BP of the p-channel structure PMOS is connected to the source terminal SP.

In the p-channel structure PMOS, there is a lateral PNP bipolar transistor LPNP, the emitter terminal of which is formed by the drain terminal DP, and the collector terminal of which is formed by the first sensor region PSEN. The base of the bipolar transistor LPNP is formed by a ground region of the p-channel structure, for example an n-doped well, which is electrically connected to the first terminal VDD.

Similarly in the case of the n-channel structure NMOS the source terminal SN is connected to a second terminal VSS or feed of a lower supply voltage, and a bulk terminal BN of the n-channel structure NMOS is likewise connected to the source terminal SN or the second terminal VSS. Here the upper supply potential is of higher voltage than the lower supply potential.

Nearby the n-channel structure NMOS a lateral NPN bipolar transistor LNPN is formed by the second sensor region NSEN, the collector terminal of the lateral NPN bipolar transistor LNPN is formed by the second sensor region NSEN, and the emitter terminal of the lateral NPN bipolar transistor LNPN is formed by the drain terminal DN of the n-channel structure NMOS. The base terminal of the bipolar transistor LNPN is formed by a ground region of the n-channel structure NMOS and is electrically connected to the second terminal VSS.

The first sensor region PSEN or the collector of the transistor LPNP is electrically connected via a first resistance element R1 to the second terminal VSS and directly to a gate terminal GN of the n-channel structure NMOS. Likewise the second sensor region NSEN, or the collector of the transistor LNPN, is connected via a second resistance element R2 to the first terminal VDD and directly to a gate terminal GP of the p-channel structure PMOS.

If there is a positive overvoltage, thus a voltage that is greater than the upper supply potential, at terminal VDD, a current will flow through the bipolar transistor LPNP through the collector and emitter, which generates a voltage drop across the first resistance element R1. This voltage drop causes a positive voltage condition between the gate terminal GN and the source terminal SN, so that the n-channel structure NMOS becomes conducting. The terminal surface PD becomes short-circuited by the second terminal VSS, so that the overvoltage at the terminal surface PD can drain via a current through the n-channel structure NMOS.

Correspondingly, if there is a positive overvoltage a low current through the lateral bipolar transistor LANA arises and a larger short circuit current flows through the channel of the n-channel structure NMOS, which is designed for the corresponding current loads.

If there is a negative overvoltage, i.e., a voltage that is lower than the lower supply potential, at the terminal surface PD, the corresponding processes with the relevant complementary structures will result. In particular, through the second sensor region NSEN as collector and the drain region DN of the n-channel structure NMOS as emitter of the lateral bipolar transistor structure LNPN, a current flow will be generated, which is fed from the first terminal VDD through the second resistance element R2. Correspondingly, through the voltage drop across the second resistance element R2 the potential at the gate terminal GP of the p-channel structure is decreased, so that the channel of the p-channel structure becomes conducting. Consequently, a short circuit current arises between the first terminal VDD and the terminal surface PD, which preferably drains the negative overvoltage. Again a low current arises through the bipolar structure LNPN and a larger current arises through the field-effect transistor structure PMOS. Because of the directed and controlled currents no charge carriers reach the substrate of the semiconductor body, which is protected against damage or destruction by this.

For the sake of completeness it is pointed out in the block diagram in FIG. 1 that the bipolar transistor structures LPNP and LNPN that are shown are not specially designed components, but rather arise merely through the correspondingly doped regions in the semiconductor body or the field-effect transistor structures as parasitic, but desirable structures.

The terminal surface PD is an output terminal. Alternatively, the terminal surface PD is an input terminal or an input/output terminal. The terminal cell is implemented both for an input and also for an output terminal.

Figure 2:
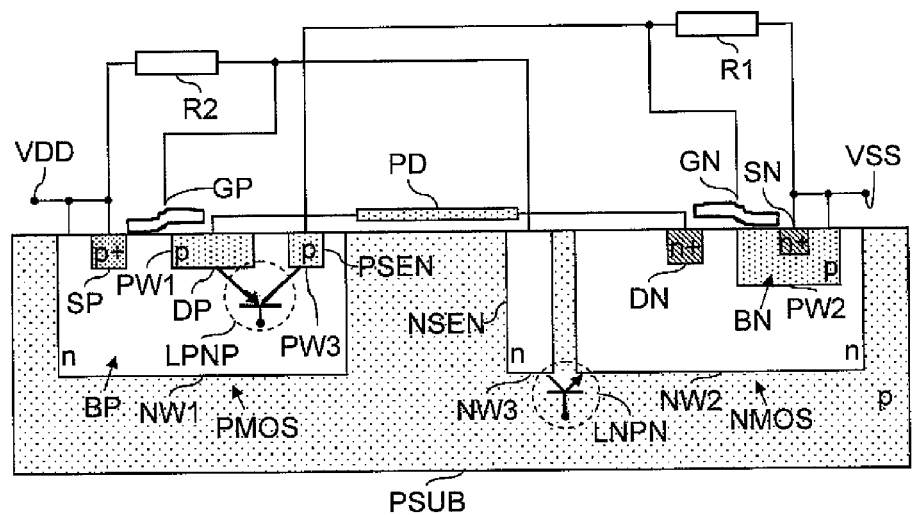
FIG. 2 illustrates another embodiment example of a semiconductor body with a terminal cell in a side cross section.

FIG. 2 illustrates a side view cross section of an embodiment example of a terminal cell in a semiconductor body. The terminal cell is made in a p-doped substrate PSUB. The p-channel structure PMOS is made in an n-doped well NW1 in the substrate PSUB, and the well NW1 is electrically connected to the first terminal VDD. A source region SP is made within well NW1 by a heavily p-doped region, which is likewise electrically connected to the first terminal VDD. A drain region DP of the p-channel structure PMOS is made by a p-doped region PW1, which is electrically connected to the terminal surface PD.

A gate electrode GP is arranged over the channel region between the source region SP and the drain region DP. Further, at a distance from the drain region DP there is another p-doped region PW3, which acts as a first sensor region PSEN. The region PW1, the well NW1 and the region PW3 form a lateral PNP bipolar structure LPNP, in which the drain region DP of the p-channel structure PMOS acts as an emitter. The first sensor region PSEN is the collector and the well NW1 forms the base of the bipolar structure LPNP.

For the n-channel field-effect transistor structure NMOS there is provided in substrate PSUB another n-doped well NW2, in which a heavily n-doped region DN is provided as the drain region of the n-channel structure NMOS. This drain region DN is electrically connected to the terminal surface PD. Furthermore, within the n-doped well NW2 there is provided a p-doped well PW2, which serves as the bulk region of the n-channel structure NMOS and which is electrically connected to the second terminal VSS. Incorporated into this p-doped well PW2 is another heavily n-doped region SN, which serves as the source region of the n-channel structure NMOS and likewise is electrically connected to the second terminal VSS. Above the channel between the drain region DN and the source region SN is a gate electrode GN, which is electrically connected to the first sensor region PSEN. A third n-doped well, NW3 is arranged in substrate PSUB at a distance from the second n-doped well NW2; it forms a second sensor region NSEN, which is electrically connected to the gate terminal GP of the p-channel structure PMOS. The terminal surface PD is arranged above a region that is situated between the p-doped well NW1 and the n-doped well NW2.

The well NW3, the substrate PSUB and the well NW2 form an NPN bipolar structure LNPN with the sensor region NSEN as collector, the substrate PSUB as base and the second well NW2 as emitter.

The remaining circuitry of the semiconductor body, or the terminal cell, with the resistance elements R1 and R2 corresponds to the arrangement described and presented in FIG. 1. Correspondingly, if there is a positive overvoltage at the terminal surface PD the lateral bipolar transistor LPNP is controlled so that the resulting current through the first resistance element R1 controls the n-channel structure NMOS, through which the overvoltage is drained to the second terminal VSS. Likewise, if there is a negative overvoltage the lateral bipolar transistor LNPN is caused to conduct, so that the resulting current through the second resistance element R2 actuates the p-channel structure PMOS. As a result, the overvoltage is drained by current flow between the first terminal VDD and the terminal surface PD.

Since the n-doped well NW1, or the bulk region BP, form the base for the bipolar structure LPNP, charged carrier drainage into substrate PSUB does not take place. An undesirable current flow in substrate PSUB can thus be effectively prevented.

Similarly, in the case of negative overvoltage the charge carrier flow takes place in the n-channel structure NMOS or in the lateral bipolar transistor LNPN. Charge carriers from the drain region DN or the second n-doped well NW2 preferably move on the surface of the semiconductor body PSUB to the second sensor region NSEN. Although in this way a charge carrier flow takes place at the surface in the substrate, the charge carrier distribution in the overvoltage case diminishes in the direction of deeper regions of the substrate PSUB. In other words, significant current in substrate PSUB is also prevented by the second sensor region NSEN.

In an alternative embodiment the first sensor region PSEN can also be arranged in substrate PSUB, similar to the arrangement of the second sensor region NSEN. In this case the first sensor region PSEN is designed as a p-doped well, in which the p-doping is heavier than that of the substrate PSUB.

Figure 3:
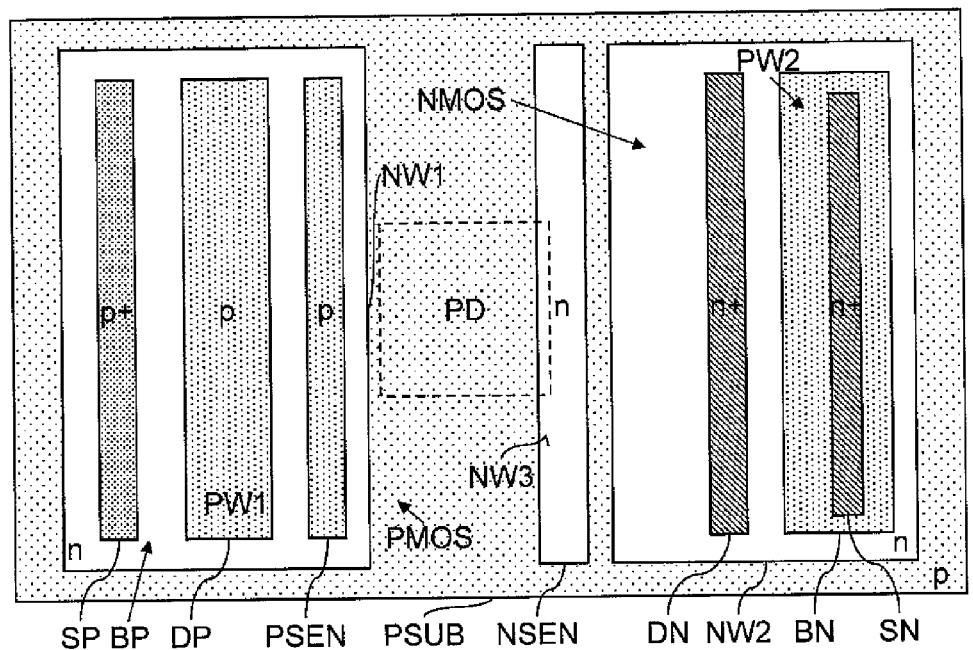
FIG. 3 illustrates another embodiment example of a semiconductor body with a terminal cell in a schematic top view.

FIG. 3 illustrates a top view of a possible embodiment of the semiconductor body with terminal cell. The n-doped wells NW1 and NW2 in this case are designed as long wells, in which the relevant other regions SP, DP and PSEN or DN, BN and SN, respectively, are incorporated. The first sensor region PSEN is in this case arranged parallel to and at a distance from the p-doped well PW1 or the drain region DP. Similarly the second sensor region NSEN is arranged in substrate PSUB parallel to the second well NW2. Thus, charge carriers can be accommodated in the full width of the relevant drain region DP or DN from the sensor regions PSEN or NSEN in order to prevent draining into the substrate PSUB.

Figure 4:
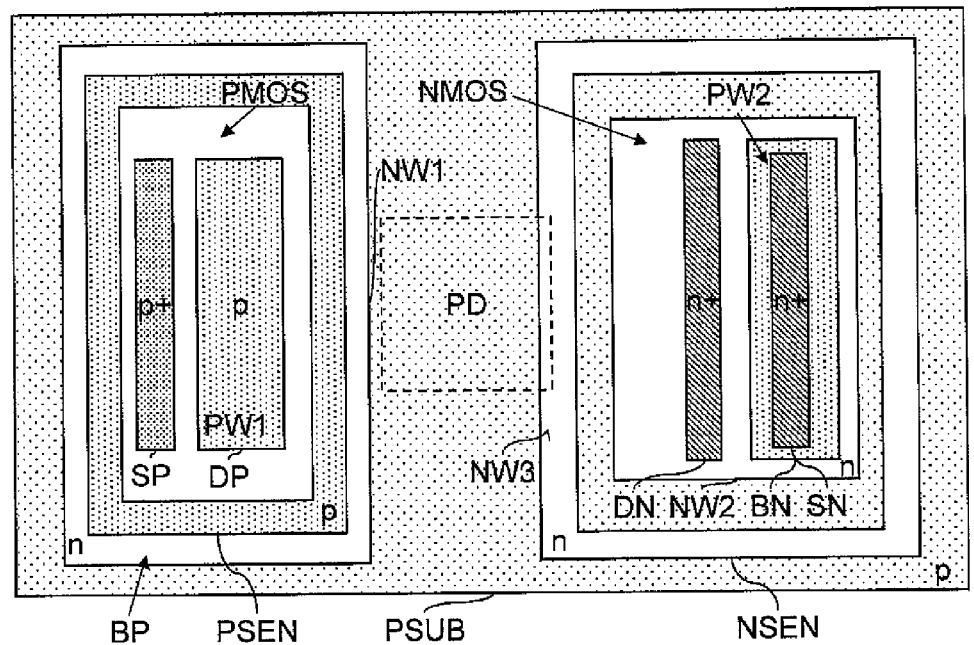
FIG. 4 illustrates still another embodiment example of a semiconductor body with a terminal cell in a schematic top view.

FIG. 4 illustrates an alternative embodiment of the semiconductor body with terminal cell. In this embodiment example the first sensor region PSEN runs in an arch shape around the source region SP and the drain region DP of the p-channel structure PMOS, where the first sensor region PSEN is arranged within the well NW1, which acts as bulk region BP. Similarly, the third n-doped well NW3 runs around the second n-doped well NW2 of the n-channel structure NMOS as the second sensor region NSEN.

With said surrounding structure of the sensor regions PSEN and NSEN, charge carriers that originate from the field-effect transistor structures PMOS and NMOS are better collected or trapped. Through this the development of charge carrier streams in substrate PSUB is prevented still more effectively.

In the embodiment shown in FIG. 4, the sensor regions PSEN and NSEN surround the relevant field-effect transistor structures PMOS and NMOS completely. In a modification thereof, however, embodiments that represent a combination of the embodiments of FIGS. 3 and 4 can also be selected. In other words, the sensor regions PSEN and NSEN can also merely surround the relevant structures in open arches, where preferably the relevant drain region DP or DN of the structures PMOS or NMOS is surrounded, since the highest charge carrier concentration to be coped with is to be expected from these regions.

Figure 5:
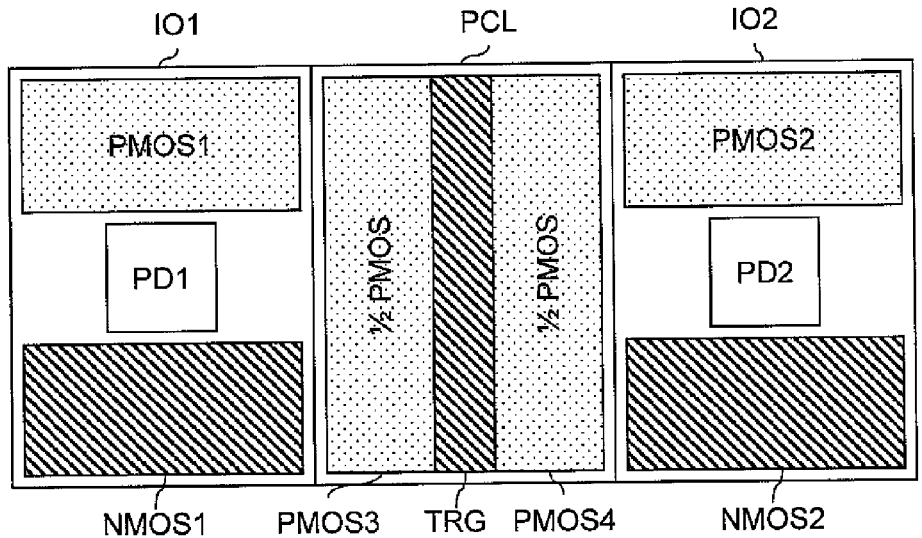
FIG. 5 illustrates an embodiment example of a semiconductor body with two terminal cells and arrester structure lying between them.

FIG. 5 illustrates another embodiment example of a semiconductor body having two terminal cells IO1 and IO2 with an arrester structure PCL lying between them. The terminal cells IO1 and IO2 each has a p-channel field-effect transistor structure PMOS1 and PMOS2, an n-channel field-effect transistor structure NMOS1 and NMOS2, and terminal surfaces PD1 and PD2. Basically speaking, the terminal cells 101 and 102 can be made as desired, but preferably they have a structure as in one of the embodiments described above or in the subsequent figures.

The arrester structure PCL has two halves of a preferably symmetrically divided p-channel field-effect transistor, between which a diode structure TRG is arranged. The notation ½PMOS in a shown first p-channel field-effect transistor structure PMOS3 and in a shown second p-channel field-effect transistor structure PMOS4 indicates that compared to a traditional arrester structure having p-channel field-effect transistors, the first and second p-channel structure PMOS3 and PMOS4 that are used here are each dimensioned to be roughly half as large.

Figure 6:
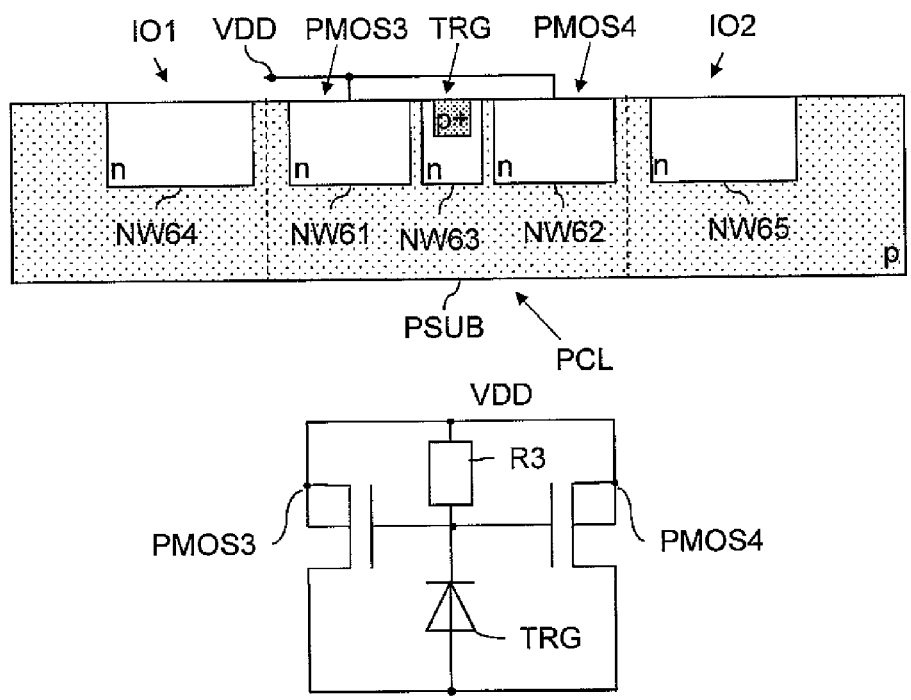
FIG. 6 illustrates another embodiment example of a semiconductor body with two terminal cells and an arrester structure in a side cross section and as an electrical block diagram.

FIG. 6 illustrates an example of a cross section of a structure of the kind in FIG. 5. An n-doped well NW64 is provided for the first terminal cell IO1 in substrate PSUB, and n-doped well NW65 is provided for the second terminal cell IO2, p-doped wells NW61 and NW62 are provided for the first and the second p-channel field-effect transistor structures PMOS3 and PMOS4, and an n-doped well NW63 is provided for the diode structure TRG. The other semiconductor regions, in particular for the first and the second terminal cells IO1 and IO2 and the first and the second field-effect transistor structures PMOS3 and PMOS4, are not shown for reasons of clarity. It is merely indicated that the n-doped wells NW61 and NW62 are electrically connected to the first terminal VDD.

The diode structure TRG has a heavily p-doped region in the n-doped well NW63 that forms a PN junction for the diode structure.

A symbolic block circuit diagram of the arrester structure PCL in which the anode of the diode structure TRG is connected to the drain terminals of the first and the second p-channel structures PMOS3 and PMOS4 is shown in FIG. 6 under the cross section drawing. The cathode of the diode structure TRG is connected to the gate terminals of the first and the second structures PMOS3 and PMOS4 directly and to the first terminal VDD via a third resistance element R3. As already indicated in the cross section in FIG. 6, the bulk terminals and the source terminals of the first and the second structures PMOS3 and PMOS4 are electrically connected to the first terminal VDD.

If there is an electrostatic discharge, there will be current flow through the diode element TRG, which activates the first and the second field-effect transistor structures PMOS3 and PMOS4 through the voltage drop across the third resistance element R3, so that said field-effect transistor structures act as arrester elements for the electrostatic discharge. The sensitivity of triggering the arrester structure PCL is dependent on the sensitivity of the diode structure TRG. To keep the arrester structure PCL from being triggered by the effect of undesired charge carriers that do not come from an electrostatic discharge, in this embodiment example the n-doped wells NW61 and NW62 are arranged around the well NW63 of the diode structure TRG so that charge carriers that may go out from the terminal cells IO1 or IO2 or their wells NW64 and NW65 are trapped by the wells NW61 and NW62 and do not reach the well NW63.

Thus, the same principle is employed in the arrangement shown in FIGS. 5 and 6 as in the case of the terminal cells from FIGS. 1-4, namely that charge carriers that otherwise might give rise to undesirable uncontrolled effects in the substrate are captured by the corresponding doped and contact regions before the said undesirable effects develop.

Compared to a traditional arrester structure, in which the trigger region or the diode structure TRG is placed directly next to the terminal cell, clearly better sensitivities with regard to undesirable triggering of the arrester elements are achieved with the proposed design. Moreover, dividing the p-channel field-effect transistor structure, which is usually made as one structure, into the two structures PMOS3 and PMOS4 does not require any additional space in integration onto the semiconductor body.

Figure 7:
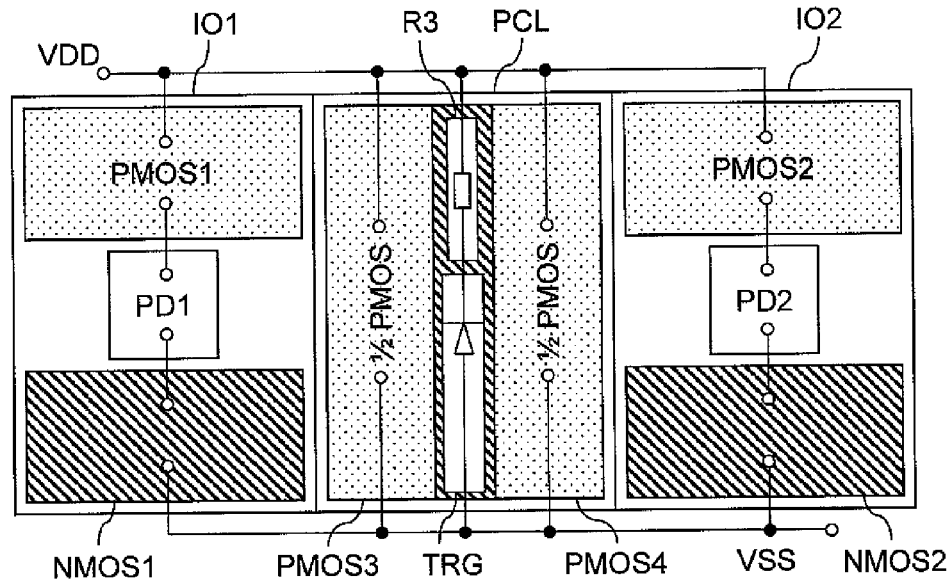
FIG. 7 illustrates another embodiment example of a semiconductor body with two terminal cells and an arrester structure lying between them.

FIG. 7 illustrates an embodiment example of a semiconductor body having two terminal cells IO1 and IO2 and an arrester structure PCL situated between them, which is a further development of the semiconductor body shown in FIG. 5. As an addition to FIG. 5 the connections to the first terminal VDD and the second terminal VSS are shown in the view in FIG. 7. Thus, the p-channel field-effect transistor structure PMOS1 of the first terminal cell IO1 couples the first terminal VDD to a first terminal surface PD1. Correspondingly, the n-channel field-effect transistor structure NMOS1 of the first terminal cell IO1 couples the second terminal VSS to the first terminal surface PD1. The same is true for the second terminal cell IO2. The middle area of the arrester structure PCL comprises the trigger structure and is situated between the area of the first p-channel field-effect transistor structure PMOS3 and the area of the second p-channel field-effect transistor structure PMOS4. In the following text, the first p-channel field-effect transistor PMOS3 is abbreviated as the first p-channel structure PMOS3, and the second p-channel field-effect transistor structure PMOS4 is abbreviated as the second p-channel structure PMOS4. The surfaces of the first and the second p-channel structures PMOS3 and PMOS4 are the same size.

The first p-channel structure PMOS3 is adjacent to the first terminal cell IO1. The second p-channel structure PMOS4 is adjacent to the second terminal cell IO2. The trigger structure is separated from the terminal cell IO1 by the first p-channel structure PMOS3 and from the second terminal cell IO2 by the second p-channel structure PMOS4. The trigger structure comprises a series circuit made of the third resistance element R3 and the diode structure TRG. The series circuit comprising the third resistance element R3 and the diode structure TRG connects the first terminal VDD to the second terminal VSS. The diode structure TRG is arranged in the blocking direction. The diode structure TRG does not conduct in a normal operating state. It becomes conducting only if there is a fault.

In an alternate embodiment (not shown) the surfaces of the first and the second p-channel structures PMOS3 and PMOS4 are different in size.

Figure 8:
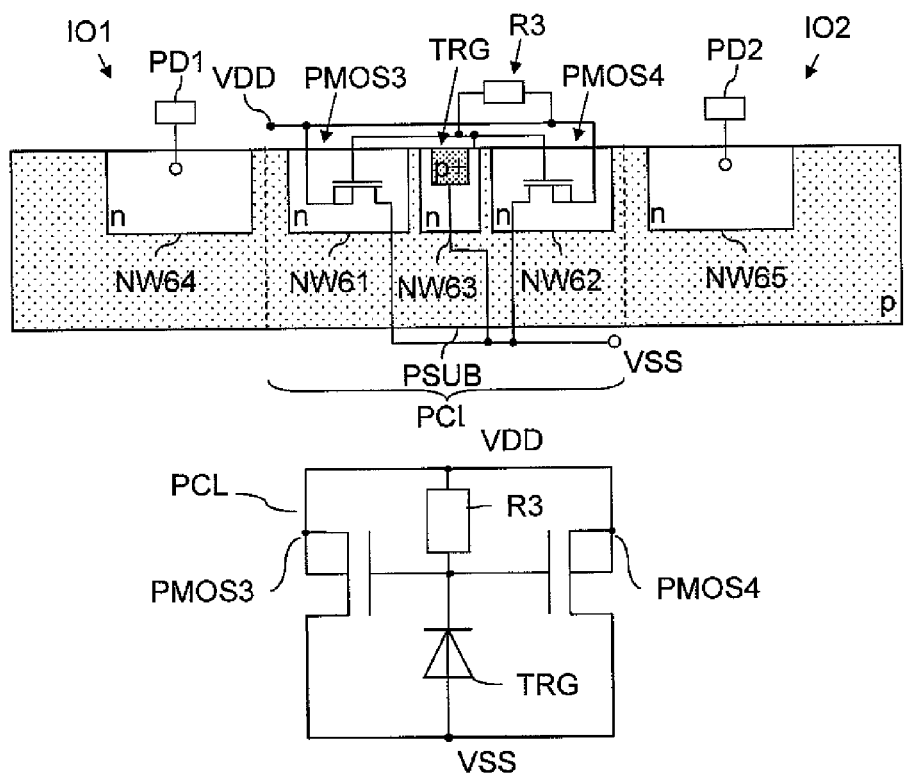
FIG. 8 illustrates another embodiment example of a semiconductor body with two terminal cells and an arrester structure in cross section and as an electrical block diagram.

FIG. 8 illustrates an example of an embodiment of a cross section of a semiconductor body, which is shown in top view in FIG. 7. Thus FIG. 8 illustrates a further development of the cross section shown in FIG. 6. The first terminal cell IO1 comprises the first terminal surface PD1 and the n-doped well NW64, which are connected together. Correspondingly, the second terminal cell IO2 comprises the second terminal surface PD2 and the n-doped well NW65, which are connected together. The components that are encompassed by the arrester structure PCL and the lines connecting the components to the first and second terminals VDD and VSS are indicated in the cross section of the semiconductor body. The first p-channel structure PMOS3 is arranged in the n-doped well NW61; its controlled section connects the first terminal VDD to the second terminal VSS. Correspondingly, the second p-channel structure PMOS4 is arranged in the n-doped well NW62; their controlled extent likewise connects the first terminal VDD to the second terminal VSS. The diode structure TRG is arranged in the n-doped well NW63. The n-doped well NW63 is arranged between the n-doped well NW61 and the n-doped well NW62. A theoretical connecting line from the n-doped well NW61 of the first p-channel structure PMOS3 to the n-doped well NW62 of the second p-channel structure PMOS4 goes through the n-doped well NW63, which comprises the diode structure TRG.

The n-doped well NW63 forms the cathode of the diode structure TRG. The p-doped region in the n-doped well NW63 forms the anode of the diode structure TRG. The anode is connected to the second terminal VSS. The cathode is connected to the first terminal VDD via the third resistance element R3. A junction between the diode structure TRG and the third resistance element R3 is connected to the control terminal of the first p-channel structure PMOS3 and to the control terminal of the second p-channel structure PMOS4.

High robustness is advantageously achieved because the trigger structure in the n-doped well NW63 is arranged between the first p-channel structure PMOS3 in the n-doped well NW61 and the second p-channel structure PMOS4 in the n-doped well NW62. Through this the diode structure TRG is protected against currents that trigger an unintended switching of the first and second p-channel structures PMOS3 and PMOS4 to a conducting operating state.

Figure 9:
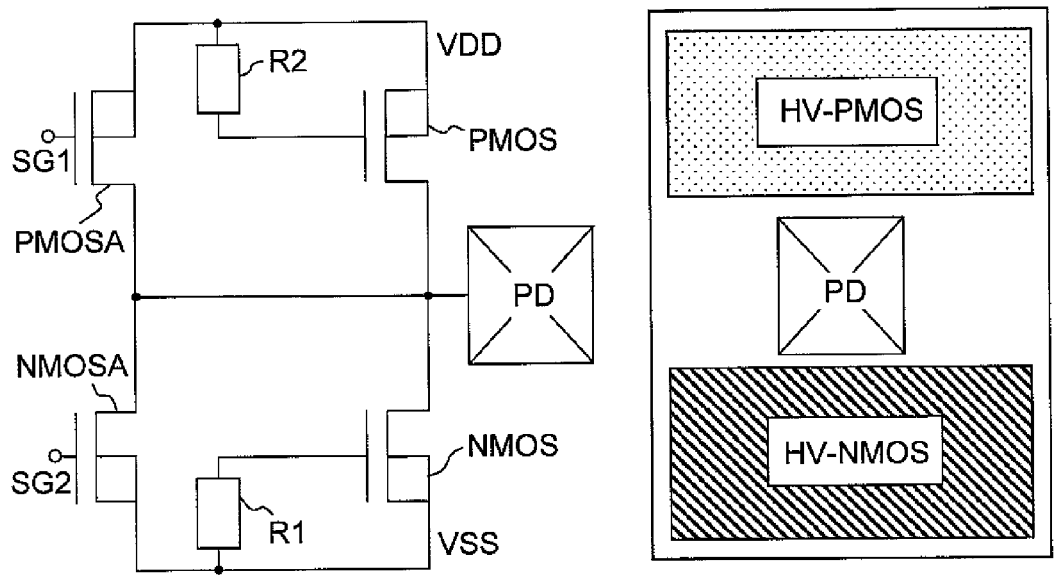
FIGS. 9 and 10 illustrate two additional embodiment examples of a semiconductor body with a terminal cell as an electrical diagram and in an overview in a semiconductor body.

FIG. 9 illustrates an alternative embodiment example of a semiconductor body having a terminal cell. The terminal cell shown in FIG. 9 can be used as the first and as the second terminal cell IO1 or IO2 in FIGS. 5, 6, 7 and 8. The p-channel structure PMOS connects the terminal surface PD that is realized as a pad to the first terminal VDD. Correspondingly the n-channel structure connects the terminal surface PD to the second terminal VSS. The first resistance element R1 couples the control terminal of the NMOS structure NMOS to the second terminal VSS. Similarly, the second resistance element R2 connects the control terminal of the p-channel structure PMOS to the first terminal VDD. Moreover, the terminal cell comprises a first and a second driver transistor PMOSA and NMOSA. The first driver transistor PMOSA is implemented as a p-channel field-effect transistor structure. The second driver transistor NMOSA is designed as an n-channel field-effect transistor structure. The first driver transistor PMOSA connects the terminal surface PD to the first terminal VDD. Similarly the second driver transistor NMOSA connects the terminal surface PD to the second terminal VSS. The first and the second driver transistors PMOSA and NMOSA and the p-channel structure PMOS and the n-channel structure NMOS are implemented as high voltage transistors.

A first control signal SG1 is sent to a control terminal of the first driver transistor PMOSA. Similarly a second control signal SG2 is sent to a control terminal of the second driver transistor NMOSA. The control terminals of the first and the second driver transistors PMOSA and NMOSA are actuated by an active circuit block (not shown). The first and the second control signals SG1 and SG2 are produced by the circuit block and comprise signals that are repeated through the terminal surface PD to an additional semiconductor body (not shown) or to a conductor plate (not shown). The terminal cell is thus implemented as an output terminal cell. The first and the second driver transistors PMOSA and NMOSA and the p-channel structure PMOS and the n-channel structure NMOS can be used both actively and passively. If they are used passively, they have the effect of an arrester element or resistor. The surface called HV-PMOS comprises the p-channel structure PMOS, the first driver transistor PMOSA and the second resistance element R2. The surface designated as HV-NMOS comprises the n-channel structure NMOS, the second driver transistor PMOSB and the first resistance element R1.

In an alternative embodiment (not shown) the first and the second driver transistors PMOSA and NMOSA are implemented as low-voltage transistors. The p-channel structure PMOS and the n-channel structure NMOS can be implemented as low-voltage transistors.

Figure 10:
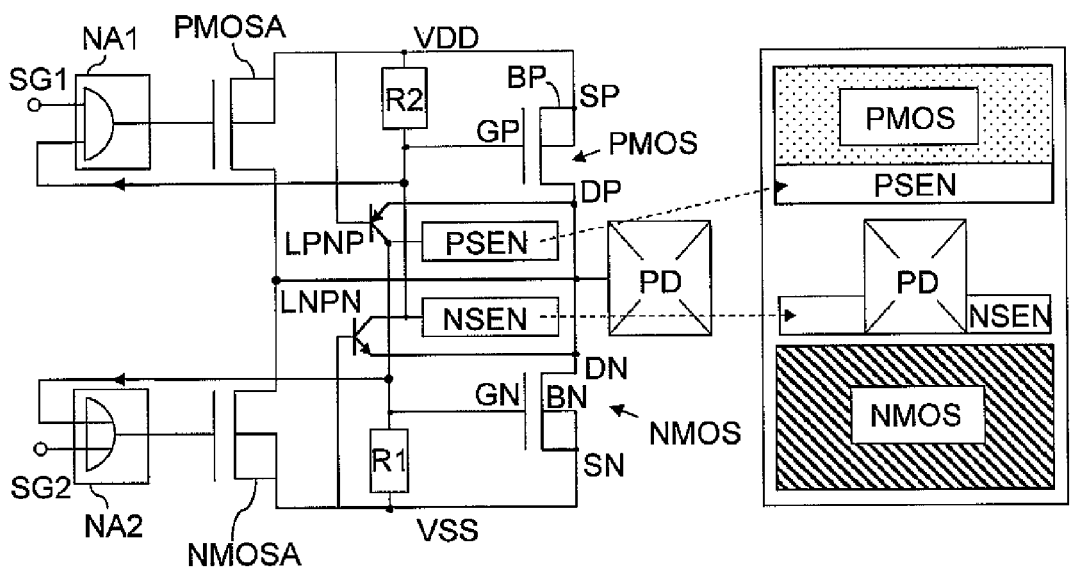

FIG. 10 illustrates an embodiment example of a semiconductor body having a terminal cell. The terminal cell in FIG. 10 can be implemented as a first and as a second terminal cell IO1 and IO2 in the semiconductor body that is shown in FIG. 5, 6, 7 or 8. The terminal cell in FIG. 10 is a further development of the terminal cells shown in FIGS. 1 and 9. The terminal cell comprises the first and the second driver transistors PMOSA and NMOSA. Here the first driver transistor PMOSA couples the terminal surface PD to the first surface VDD. Correspondingly, the second driver transistor NMOSA connects the terminal surface PD to the second terminal VSS.

Additionally, the arrangement comprises a first and a second logic circuit NA1 and NA2. The first logic circuit NA1 implements an AND function. The second logic circuit NA2 implements an OR function. The first and the second logic circuits NA1 and NA2 can comprise a plurality of NOT-OR gates or NOT-AND gates to implement their relevant functions. An output of the first logic circuit NA1 is connected to a control terminal of the first driver transistor PMOSA. The control terminal GP of the p-channel structure PMOS is connected to a first input of the first logic circuit NA1. Correspondingly, the output of the second logic circuit NA2 is connected to the control terminal of the second driver transistor NMOSA. The control terminal GN of the n-channel structure NMOS is connected to a first output of the second logic circuit NA2.

The first and the second driver transistors NMOSA and PMOSA are active components. Also, the first and the second driver transistors PMOSA and NMOSA can, in the section of the semiconductor body shown in the right hand side of FIG. 10, be integrated into the surfaces designated as NMOS or PMOS, respectively.

The first control signal SG1 is sent to a second input of the first logic circuit NA1. The voltage tapped at the junction between the second resistance element R2 and the second sensor region NSEN is sent to the first input of the first logic circuit NA1. Correspondingly, the second control signal SG2 is sent to a second input of the second logic circuit NA2. A voltage tapped at the junction between the first resistance element R1 and the first sensor region PSEN is sent to the first input of the second logic circuit NA2.

The first and the second driver transistors PMOSA and NMOSA are comprised of the terminal cell and contribute to decomposition of overvoltage at the terminal surface PD. By means of the first logic circuit NA1 and the connection of the first input of the first logic circuit NA1 to the control terminal of the p-channel structure PMOS, the first driver transistor PMOSA is also switched to be conducting when the p-channel structure PMOS is conducting. The same is true for the second driver transistor NMOSA and the n-channel structure NMOS.

In normal operation the first driver transistor PMOSA is switched to be conducting or nonconducting in correspondence with the first control signal SG1. In normal operation there is no overvoltage present. Through the coupling of the driver transistors PMOSA and NMOSA with the p-channel or n-channel structures, respectively, PMOS and NMOS, if there is an overvoltage the conductivity of the structures through which the currents necessary to eliminate the overvoltage is advantageously increased. In this way high surface utilization efficiency is achieved. The arrester structure PCL and the first and the second terminal cells IO1 and IO2 are designed for high voltage applications.

FIGS. 11A to 11D show alternative embodiments of the block circuit diagram of the arrester structure PCL described in FIGS. 5 to 8. According to FIG. 11A, the arrester structure PCL comprises a trigger transistor TT instead of the third resistance element R3. A series circuit of the trigger transistor TT and the diode element TRG is arranged between the first terminal VSS and the second terminal VDD. A controlled section of the trigger transistor TT couples the diode element TRG to the first terminal VDD via a trigger node TN. The trigger transistor TT is realized as a field-effect transistor. The trigger transistor TT is implemented as a junction field-effect transistor. The trigger transistor TT is designed as a p-channel junction field-effect transistor. The trigger node TN is connected to the control terminals of the first and the second p-channel structures PMOS3, PMOS4. The trigger transistor TT is fabricated inside the n-doped well NW63 shown in FIGS. 5 to 8.

A terminal of the diode element TRG is coupled to the control terminals of the first and the second p-channel structures PMOS3, PMOS4. The n-doped well of the diode structure TRG is connected to the gate terminals of the first and the second p-channel structures PMOS3, PMOS4. The voltage drop across the diode structure TRG is applied to the control terminals of the first and the second p-channel structure PMOS3, PMOS4. In case of an electrostatic discharge the voltage drop across the diode structure TRG is sufficient low to activate the first and the second p-channel structures PMOS3, PMOS4 such that each p-channel structure PMOS3, PMOS4 provides a conducting path between the second terminal VDD and the first terminal VSS. Without an electrostatic discharge, the control terminals of the first and the second p-channel structures PMOS3, PMOS4 approximately obtain the potential of the second terminal VDD and said p-channel structures PMOS3, PMOS4 are in a non-conducting operating state.

Furthermore, the semiconductor body comprises a control circuit CC which is connected to a control terminal TC of the trigger transistor TT. The control circuit CC is arranged outside the n-doped well NW63. The control circuit CC is realized as a latch-up detector circuit. Alternatively, the control circuit CC is implemented as an overvoltage detector circuit. In case of a latch-up or an overvoltage condition the control circuit CC sets the trigger transistor TT in such an operating state that the voltage at the trigger node TN is sufficient to activate the first and the second p-channel structures PMOS3, PMOS4. By activating the first and the second p-channel structures PMOS3, PMOS4, both p-channel structures PMOS3, PMOS4 are set in a conducting operating state. Thus, an overvoltage at the second terminal VDD is reduced by the activated and therefore conducting first and second p-channel structures PMOS3, PMOS4.

Alternatively, the trigger transistor TT is fabricated outside the n-doped well NW63.

In an alternative, not shown embodiment, the trigger transistor TT is designed as an n-channel junction field-effect transistor.

Figure 11A:
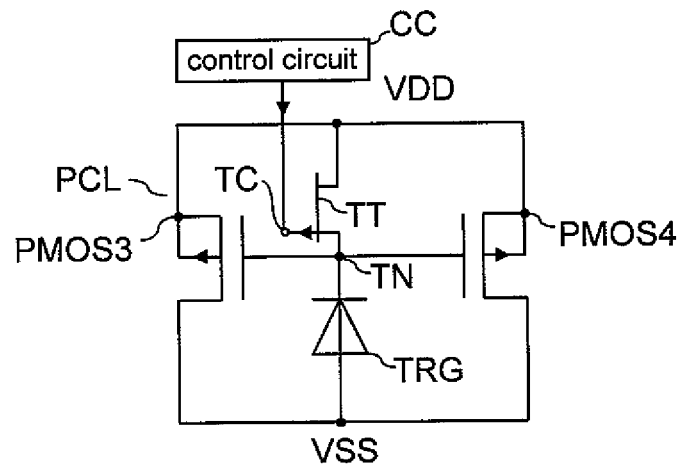
FIGS. 11A to 11D illustrate alternative embodiments of an arrester structure.
Figure 11B:
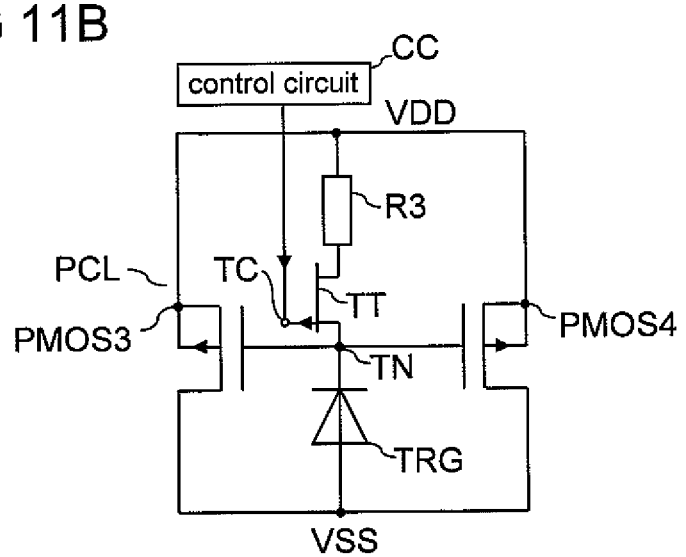

FIG. 11B shows an alternative block circuit diagram which is a further development of the embodiments shown in FIGS. 5 to 8 and 11A. The arrester structure PCL comprises the third resistance element R3 and the trigger transistor TT which are connected in series. The series circuit of the third resistance element R3 and the trigger transistor TT couples the second terminal VDD to the diode element TRG via the trigger node TN. The third resistance element R3 is connected to the second terminal VDD, whereas the trigger transistor TT is connected to the trigger node TN. The trigger transistor is implemented as p-channel junction FET. Alternatively, the trigger transistor TT is realized as an re-channel junction field-effect transistor. An output of the control circuit CC controls the control terminal of the trigger transistor TT.

Alternatively, the third resistance element R3 is connected to the trigger node TN and the trigger transistor TT is connected to the second terminal VDD.

Figure 11C:
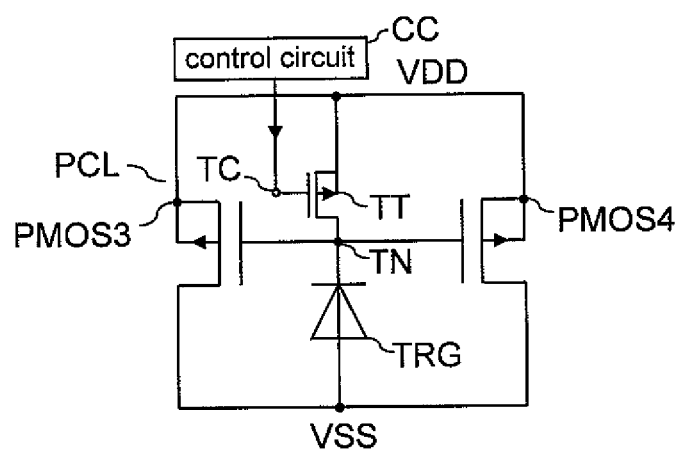

FIG. 11C shows an alternative block circuit diagram of the arrester structure PCL that is a further development of the embodiments shown in FIGS. 5 to 8, 11A and 11B. The trigger transistor TT is designed as a metal-oxide-semiconductor field-effect transistor. The trigger transistor TT is implemented as a p-channel metal-oxide semiconductor field-effect transistor.

In an alternative, not shown embodiment, the trigger transistor TT is designed as an n-channel metal-oxide-semiconductor field-effect transistor.

Figure 11D:
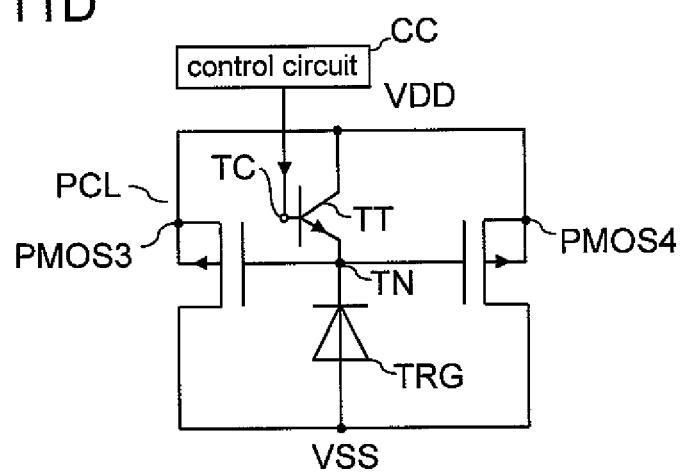

FIG. 11D shows an alternative block circuit diagram of the arrester structure PCL that is a further development of the embodiments shown in FIGS. 5 to 8 and 11A to 11C. The trigger transistor TT is fabricated as a bipolar transistor. The trigger transistor TT is realized as an npn-transistor. The control circuit CC is connected to the control terminal TC that is the basis terminal of the trigger transistor TT. The collector and the emitter of the trigger transistor TT are connected to the second terminal VDD and to the trigger node TN, respectively.

In an alternative, not shown embodiment, the trigger transistor TT is realized as a pnp-transistor.

In alternative, not shown embodiments of the arrester structure PCL shown in FIGS. 11C and 11D, the arrester structure PCL additionally comprises the third resistance element R3 that is connected in series to the trigger transistor TT.

In an alternative, not shown embodiment, the control terminal TC of the trigger transistor TT in the arrester structure PCL shown in the FIGS. 11A to 11D is connected to the second terminal VDD. The control circuit CC is omitted in this embodiment.

In case the trigger transistor TT is implemented as an re-channel junction field-effect transistor, an n-channel metal-oxide-semiconductor field-effect transistor or a pnp-transistor, the control terminal TC can alternatively be connected to the first terminal VSS or the trigger node TN. The control circuit CC is omitted in this case.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A semiconductor body having a first terminal for feeding an upper supply potential and having a first and a second terminal cell, which are formed at a distance from each other, additionally comprising an arrester structure, which is formed between the first and the second terminal cell in a p-doped substrate, the arrester structure comprising:
    a first and a second p-channel field-effect transistor structure, which are formed in the relevant n-doped wells essentially parallel to the first and second terminal cell; and
    a diode structure, which is formed with a p-doped region in an additional n-doped well between the n-doped wells of the first and the second p-channel field-effect transistor structure, wherein the diode structure is configured to activate the first and the second p-channel field-effect transistor structure as arrester elements if there is an electrostatic discharge in the semiconductor body.

2. The semiconductor body as in claim 1, wherein the first and the second terminal cell are formed so that the first and the second terminal cell each comprise:
    a terminal surface;
    the first terminal;
    a second terminal for feeding of a lower supply potential;
    a p-channel field-effect transistor structure formed in the semiconductor body, which structure has a p-doped first sensor region at a distance from its drain region; and
    an n-channel field-effect transistor structure formed in the semiconductor body, which structure has an n-doped second sensor region formed at a distance from its drain region;
    wherein in the p-channel field-effect transistor structure, the drain region is electrically connected to the terminal surface, a source region is electrically connected to the first terminal, and the first sensor region is electrically connected via a first resistance element to the second terminal and is directly electrically connected to a gate terminal of the n-channel field-effect transistor structure;
    wherein in the n-channel field-effect transistor structure, the drain region is electrically connected to the terminal surface, a source region is electrically connected to the second terminal, and the second sensor region is electrically connected via a second resistance element to the first terminal and is directly electrically connected to a gate terminal of the p-channel field-effect transistor structure; and
    wherein the semiconductor body comprises the p-doped substrate, in which the p-channel field-effect transistor structure and the n-channel field-effect transistor structure are formed.

3. The semiconductor body as in claim 2,
    wherein the first sensor region and the drain region of the p-channel field-effect transistor structure as well as a region lying between them form a pnp bipolar structure.

4. The semiconductor body as in claim 2,
    wherein the first sensor region and the drain region of the n-channel field-effect transistor structure as well as a region lying between them form a npn bipolar structure.

5. The semiconductor body as in claim 2,
    wherein the p-channel field-effect transistor structure is made in a first n-doped well within the substrate, wherein the associated drain region and the associated source region are each made as p-doped regions within the first n-doped well and the first n-doped well is electrically connected to the first terminal.

6. The semiconductor body as in claim 5,
    wherein the first sensor region is formed within the substrate, wherein the first sensor region is more heavily p-doped than the substrate.

7. The semiconductor body as in claim 5,
    wherein the first sensor region is formed within the first n-doped well.

8. The semiconductor body as in claim 5,
    wherein the first sensor region is arranged parallel to and at a distance from the drain region of the p-channel field-effect transistor structure.

9. The semiconductor body as in claim 5,
    wherein the first sensor region is arranged at least partially in an arch running around the drain region and the source region of the p-channel field-effect transistor structure.

10. The semiconductor body as in claim 2, wherein the n-channel field-effect transistor structure is formed in a second n-doped well within the substrate, wherein the drain region of the n-channel field-effect transistor structure is formed as an n-doped region within the second n-doped well and is more heavily n-doped than the second n-doped well
    wherein the source region of the n-channel field-effect transistor structure is formed in a p-doped well within the second n-doped well;
    wherein the p-doped well is electrically connected to the second terminal; and
    wherein the second sensor region is arranged at a distance from the second n-doped well.

11. The semiconductor body as in claim 10,
    wherein the second sensor region is arranged parallel to and at a distance from the second n-doped well.

12. The semiconductor body as in claim 10,
    wherein the second sensor region is arranged at least partially in an arch running around the second n-doped well.

13. The semiconductor body as in claim 1,
    wherein the additional n-doped well is electrically connected via a third resistance element to the first terminal and is directly electrically connected to gate terminals of the first and second p-channel field-effect transistor structure.

14. The semiconductor body as in claim 1, wherein the p-doped region of the diode structure is connected to the second terminal.

15. The semiconductor body as in claim 1, wherein the relevant p-doped wells of the first and the second p-channel field-effect transistor structure are electrically connected to the first terminal.

* * * * *